United States Patent [19]
Nomura et al.

[11] Patent Number: 5,591,993
[45] Date of Patent: Jan. 7, 1997

[54] STRUCTURE FOR CONNECTING FLAT TYPE SEMICONDUCTOR SWITCHES IN PARALLEL

[75] Inventors: Toshihiro Nomura, Tokyo; Masaaki Hisamoto, Mie; Iwao Kurata, Tokyo, all of Japan

[73] Assignee: Fuji Electric Co., Ltd., Kawasaki, Japan

[21] Appl. No.: 410,136

[22] Filed: Mar. 23, 1995

[30] Foreign Application Priority Data

Mar. 24, 1994 [JP] Japan ..................... 6-052397

[51] Int. Cl.$^6$ .................... H01L 23/48; H01L 29/417
[52] U.S. Cl. .................... 257/181; 257/277; 257/587; 257/696; 257/724; 257/773; 257/785
[58] Field of Search .................... 257/773, 775, 257/785, 696, 664, 277, 587, 181, 723, 724

[56] References Cited

U.S. PATENT DOCUMENTS

| | | |
|---|---|---|
| 3,105,922 | 10/1963 | Fukui ..................... 257/724 |
| 4,516,149 | 5/1985 | Wakui ..................... 257/773 |
| 4,612,561 | 9/1986 | Kimura et al. ..................... 357/38 |
| 5,132,896 | 7/1992 | Nishizawa et al. ..................... 357/38 |

FOREIGN PATENT DOCUMENTS 638507 2/1994 Japan.

OTHER PUBLICATIONS

RCA Tech. Notes No. 85 Oct. 16 1969 Denning.

*Primary Examiner*—Jerome Jackson
*Attorney, Agent, or Firm*—Thomas R. Morrison; Christopher R. Pastel

[57] ABSTRACT

A connection structure for connecting a plurality of semiconductor switches in parallel includes a pressed contact for a semiconductor switch. The pressed contact includes a layered structure which connects a drain conductor to a plurality of drain electrodes, a source conductor to a plurality of source electrodes, a gate conductor to a plurality of gate electrodes, and an insulating film between the gate conductor and the source conductor. The gate electrodes are a plurality of resilient elastic wings which are pressed upward against the gate conductor, thereby ensuring a good electrical connection.

12 Claims, 3 Drawing Sheets 5,591,993

1

STRUCTURE FOR CONNECTING FLAT TYPE SEMICONDUCTOR SWITCHES IN PARALLEL

BACKGROUND OF THE INVENTION

The present invention relates to a parallel connection of a plurality of flat type semiconductor switches which enables the semiconductor switches to switch ON and OFF simultaneously at high speed without causing significant switching time differences.

Semiconductor switches facilitate easy and smooth DC to AC or AC to DC electric power conversion. However, a single semiconductor switch has a limited capacity which limits the wattage of electric power convertible by a semiconductor switch. Therefore, the power conversion capacity of a semiconductor switching apparatus is increased by connecting many semiconductor switches in parallel.

Referring to FIG. 6, a prior art semiconductor switch 2 includes a drain electrode D, a gate electrode G, and a source electrode S, all on a substrate.

Referring now to FIG. 5, three semiconductor switches 2a, 2b, 2c, of the type shown in FIG. 6, are connected in parallel. In the prior art, drain electrodes D of all three semiconductor switches 2a, 2b and 2c are connected in common to a drain line 6. Source electrodes S are connected in common to a source line 7. Since power conversion requires semiconductor switches 2a, 2b, 2c to switch ON and OFF simultaneously, gate electrodes G of semiconductor switches 2a, 2b, 2c are connected in common to a gate line 8. Source line 7 and gate line 8 are connected with a gate drive circuit 5.

Gate drive circuit 5 applies an ON-voltage between gate electrode G and source electrode S, thereby causing an ON-current to flow from gate electrode G to source electrode S of each of semiconductor switches 2a, 2b, 2c and causing semiconductor switches 2a, 2b, 2c to turn ON simultaneously. When gate drive circuit 5 stops applying the ON-voltage or applies a voltage of opposite polarity to the ON-voltage between the gate electrode and the source electrode, an OFF-current flows from source electrode S to gate electrode G of each of semiconductor switches 2a, 2b, 2c causing semiconductor switches 2a, 2b, 2c to turn OFF simultaneously.

When gate drive circuit 5 and semiconductor switches 2a, 2b, 2c are connected as shown in FIG. 5, a length of gate line 8 between gate drive circuit 5 and gate electrode G of semiconductor switch 2b is longer than a line length between gate drive circuit 5 and gate electrode G of semiconductor switch 2a. In addition, a line length between gate drive circuit 5 and gate electrode G of semiconductor switch 2c is much longer than the line length between gate drive circuit 5 and gate electrode G of semiconductor switch 2a.

For example, when the line length between the gates of neighboring semiconductor switches is several tens of centimeters, wiring inductance L of the gate line and source line is several hundred nH. Static capacitance C of the gate of a large capacity semiconductor switch of several hundred amps and several hundred volts is several hundreds nF. A transmission delay time of a signal (ON-current) from gate drive circuit 5 between neighboring gate electrodes is almost proportional to a root of a product of the wiring inductance L and the static gate capacitance C. Therefore, when a number of semiconductor switches are connected in parallel with wiring inductance L and static gate capacitance C are

2 in the above stated ranges of inductance and capacitance, the transmission delay time is several hundreds of nanoseconds.

Since the wiring inductance L causes signal transmission delay between semiconductor switches, such as, for example, semiconductor switches 2a and 2c in the parallel circuit of FIG. 5, the signal transmission delay causes a further time difference of several hundred nanoseconds or more in the ON-OFF operations of the switches. In the transition from ON to OFF, turn-off current localizes to that semiconductor switch which switches OFF later than the others. The turn-off loss therefore localizes to this delaying semiconductor switch. In transition from OFF to ON, turn-on current localizes to that semiconductor switch which switches ON earlier than the others.

Since the losses localize to particular semiconductor switches if the time difference exists in ON-OFF operation, it is meaningless to connect many semiconductor switches in parallel. If many semiconductor switches are connected in parallel, convertible electric power fails to increase as much as intended. Using a thick gate line to reduce wiring inductance L requires additional space for wiring and connection. In addition, connecting thick lines is not easy. Since the inductance of the main circuit conductors (anode side wiring and cathode side wiring) in a semiconductor switching apparatus for high electric power conversion should be small, it is not allowable to leave a space around the semiconductor switches through which excessive magnetic flux passes. Thus, room is needed for screw-type or soldering connections.

OBJECTS AND SUMMARY OF THE INVENTION

In view of the foregoing, an object of the present invention is to overcome the limitations and drawbacks of the prior art.

Another object of the invention is to provide a parallel connection structure for semiconductor switches which reduces wiring inductance between the control electrodes.

A further object of the present invention is to provide a parallel connection structure for semiconductor switches which reduces the variation in action time between the switches.

Briefly stated, a connection structure for connecting a plurality of semiconductor switches in parallel includes a pressed contact for a semiconductor switch. The pressed contact includes a layered structure which connects a drain conductor to a plurality of drain electrodes, a source conductor to a plurality of source electrodes, a gate conductor to a plurality of gate electrodes, and an insulating film between the gate conductor and the source conductor. The gate electrodes are a plurality of resilient elastic wings which press upward against the gate conductor, thereby ensuring a good electrical connection.

According to an embodiment of the invention, a connection structure for connecting a plurality of flat semiconductor switches in parallel includes a plurality of first electrodes on a first surface of each of the semiconductor switches, a plurality of second electrodes protruding from a second surface of each of the semiconductor switches, a plurality of elastic third electrodes on the second surface and insulated from the second electrodes, a first conductor, a second conductor, a third conductor, an insulating film interposed between the second and third conductors, means for pressing the first conductor and the second conductor toward each other, thereby establishing pressed contact of the first conductor with the first electrodes, the second conductor with the second electrodes, and the third conductor with the third electrodes.

According to a feature of the invention, the connection structure includes connecting means, made of a same material as the third conductor, for connecting a plurality of third conductors at ends thereof.

According to a feature of the invention, each semiconductor switch includes a MOSFET, the first electrodes are drain electrodes, the second electrodes are source electrodes, and the third electrodes are gate electrodes.

According to a feature of the invention, each semiconductor switch includes an IGBT, the first electrodes are drain electrodes, the second electrodes are source electrodes, and the third electrodes are gate electrodes.

According to a feature of the invention, each semiconductor switch includes a thyristor, the first electrodes are anodes, the second electrodes are cathodes, and the third electrodes are gate electrodes.

According to a feature of the invention, each semiconductor switch includes a bipolar transistor, the first electrodes are collector electrodes, the second electrodes are emitter electrodes, and the third electrodes are base electrodes.

According to an embodiment of the invention, a connection structure for connecting a plurality of flat semiconductor switches in parallel includes a plurality of first electrodes on a first surface of each of the semiconductor switches, a plurality of second electrodes protruding from a second surface of each of the semiconductor switches, a plurality of elastic third electrodes on the second surface and insulated from the second electrodes, a first conductor, a second conductor, at least two third conductors, at least two fins protruding from and bent substantially parallel with the second conductor, whereby each third conductor has an associated fin, each of the third conductors being bent into a U-shape and having first and second arms, the first arm being between the second conductor and the associated fin, the second arm being between the associated fin and the first electrodes, an insulating film interposed between the second and third conductors and between the associated fin and the third conductor, means for pressing the first conductor and the second conductor toward each other, thereby establishing pressed contact of the first conductor with the first electrodes, the second conductor with the second electrodes, and the third conductors with the third electrodes.

According to an embodiment of the invention, a connection structure for connecting a plurality of semiconductor switches in parallel includes a plurality of first electrodes on a first surface of each of the semiconductor switches, a plurality of second electrodes protruding from a second surface of each of the semiconductor switches, a plurality of elastic third electrodes on the second surface and insulated from the second electrodes, a first conductor, a second conductor, a third conductor being substantially shaped as a hollow rectangle having two long strips and two short strips, at least two fins protruding from and bent substantially parallel with the second conductor, whereby each of the two long strips of the third conductor has an associated fin, each of the two long strips of the third conductor being bent into a U-shape and having first and second arms, the first arm being between the second conductor and the associated fin, the second arm being between the associated fin and the first electrodes, an insulating film interposed between the second and third conductor and between the associated fin and the third conductor, and means for pressing the first conductor and the second conductor toward each other, thereby establishing pressed contact of the first conductor with the first electrodes, the second conductor with the second electrodes, and the third conductor with the third electrodes.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 2a is a side view of the first embodiment of the present invention.

FIG. 2b is a plan view of the embodiment shown in FIG. 2a.

FIG. 2c is an exploded cross section view taken along A—A in FIG. 2a.

DETAILED DESCRIPTION OF THE PREFERRED EMBODIMENT

Figure 1:
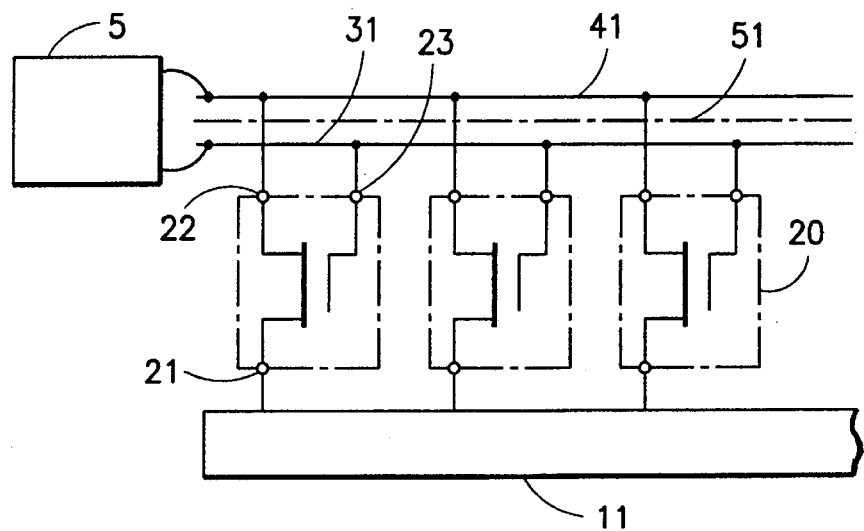
FIG. 1 is a circuit diagram showing an outline of a connection structure according to the present invention.
Figures 2A, 2B:
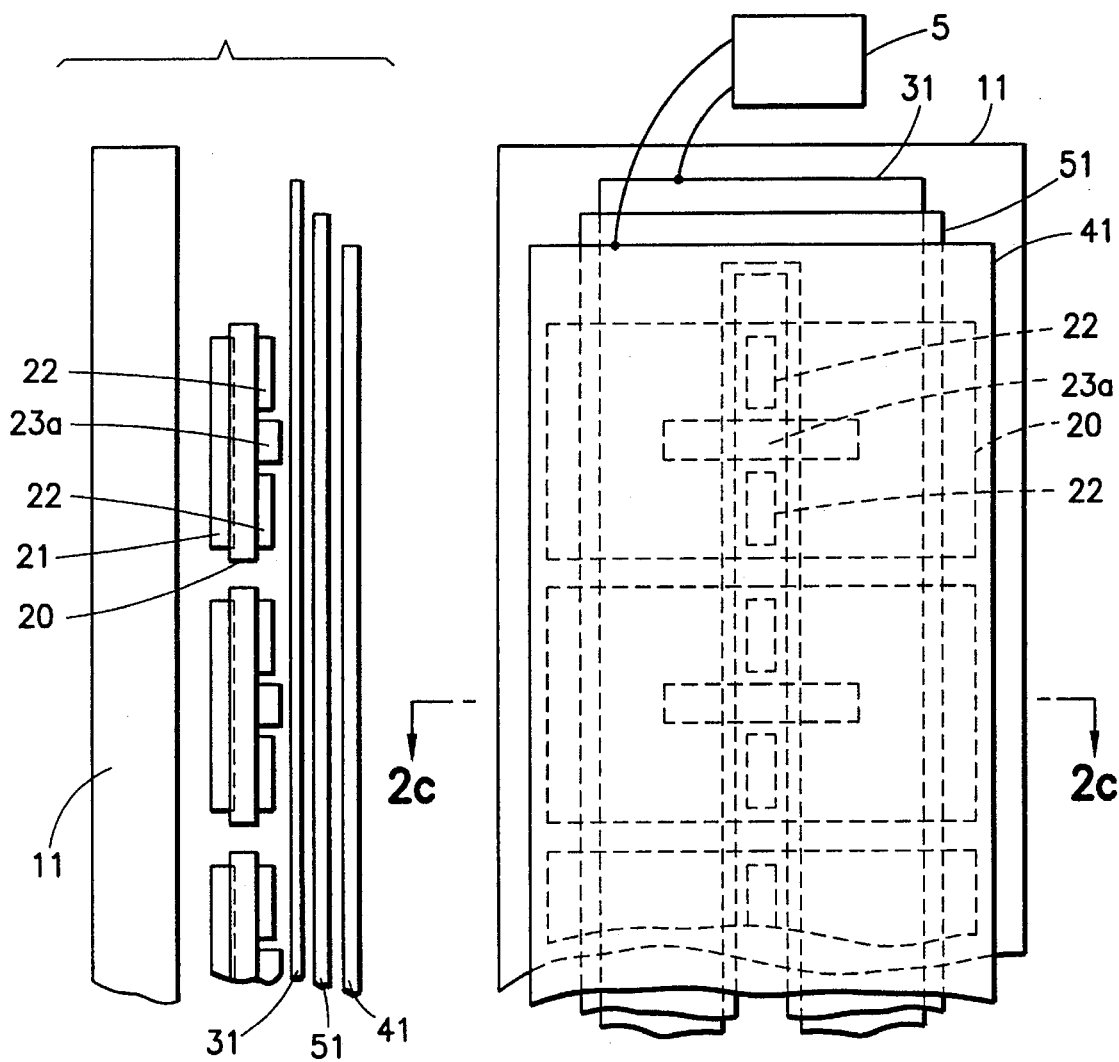
Figure 2C:
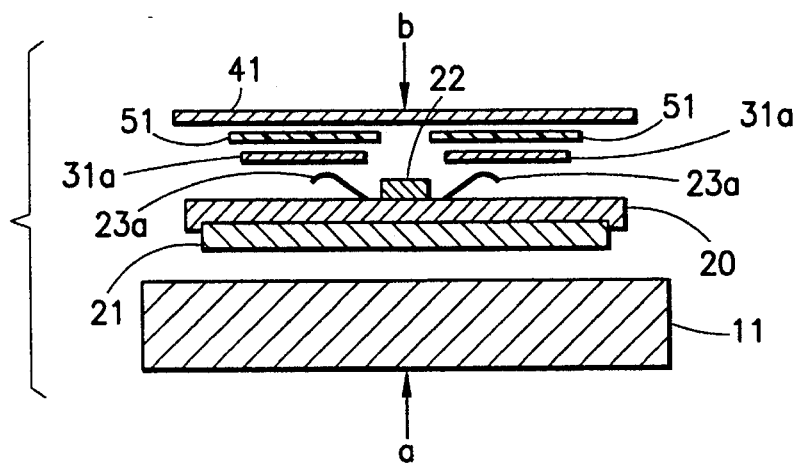
Figure 5:
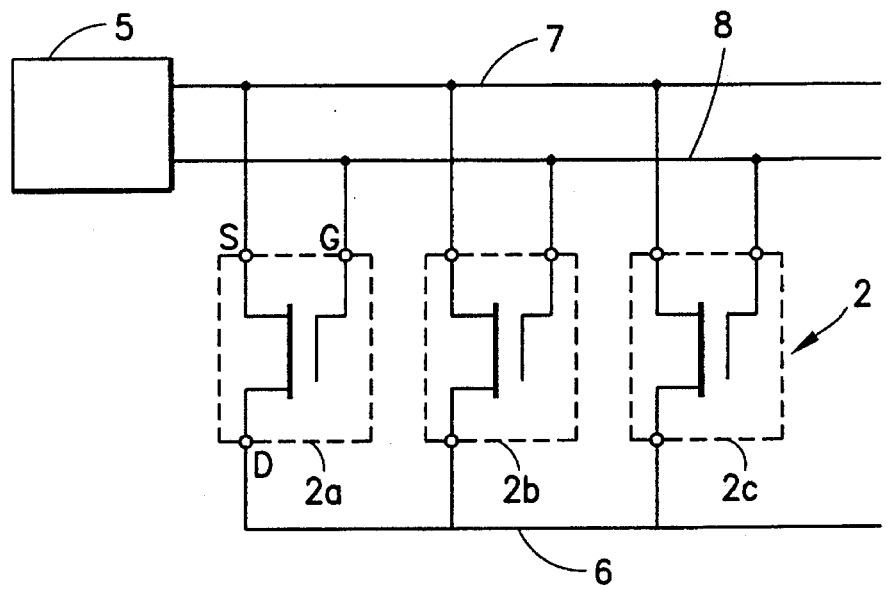
FIG. 5 is a circuit diagram showing an outline of a general circuit which connects a plurality of semiconductor switches in parallel according to the prior art.
Figure 6:
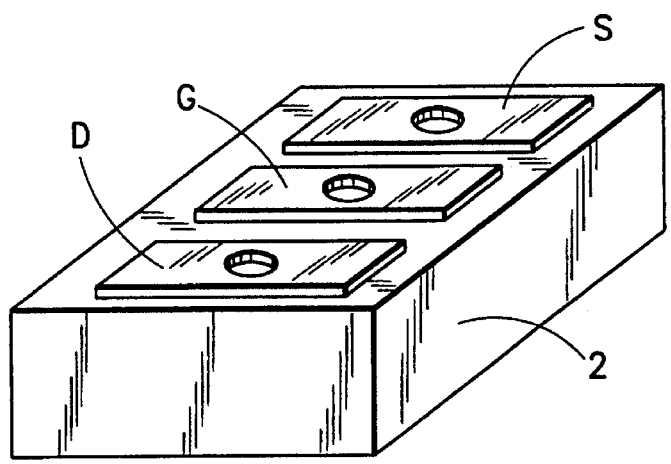
FIG. 6 is a perspective view showing the external structure of a semiconductor switch used in the prior art.

Referring to FIGS. 1 and 2c, a connection structure according to the present invention is shown which connects a plurality of semiconductor switches 20 in parallel. Each semiconductor switch 20 is, for example, a MOSFET or an IGBT. A plurality of drain electrodes 21 are connected to a wide drain conductor 11. A plurality of source electrodes 22 are connected to a stripe source conductor 41. A plurality of gate electrodes 23 are connected to a thin film gate conductor 31. Source conductor 41 and gate conductor 31 are insulated from each other by an insulating film 51.

Figure 3:
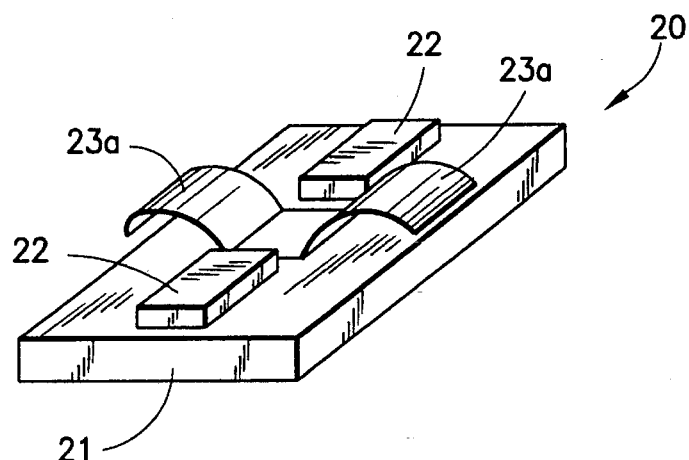
FIG. 3 is a perspective view of the external structure of a semiconductor switch used in the embodiments of the present invention.

Referring to FIG. 3, one semiconductor switch 20 is shown. Source electrodes 22 are mounted on drain electrode 21. Gate electrode 23 includes two resilient elastic wings 23a protruding generally upward and outward from drain electrode 21.

Referring to FIGS. 2a–2c, semiconductor switches 20 are connected in parallel. As shown in FIG. 2c, drain conductor 11 is pressed upward as shown by an arrow a against drain electrode 21 by a pressing means (not shown) forming a good electrical connection. Source conductor 41 is pressed downward as shown by an arrow b against source electrode 22 by a pressing means (not shown). As source conductor 41 presses downward, it moves two insulating films 51,51 and two gate conductor strips 31a, 31a downward until gate conductor strips 31a, 31a are forced tightly against elastic wings 23a of gate electrode 23. A spring force of elastic wings 23a ensures a good electrical connection. Gate conductor strips 31a, 31a are insulated from source conductor 41 by insulating films 51, 51.

When a number of gate electrodes 23 are driven by the same signal, inductance between conductor strips 31a, 31a is halved by connecting them together. As shown in FIG. 2b, gate conductor 31 is preferably formed in a rectangular loop with gate conductor strips 31a, 31a forming the long sides of the rectangle. Alternatively, gate conductor strips 31a, 31a can be connected at their ends with connecting means made of the same material as gate conductor 31. If elastic wings 23a, 23a are driven by different signals to perform different operations, this connection of gate conductor strips 31a, 31a is unnecessary.

Since insulating films 51, 51 are inserted between source conductor 41 and gate conductor strips 31a, 31a, the inductance of film gate conductor strips 31a, 31a is smaller than in a conventional wire connection.

The ON-OFF signals flow from gate drive circuit 5 to gate electrodes 23 through wide film gate conductor strips 31a and wide source conductor 41, which are tightly connected to each other with thin insulator film 51 in between. Since this arrangement compensates the magnetomotive force generated by the gate current, the parallel connection structure according to the present invention limits the wiring inductance to as low as several nH even when 5 to 10 semiconductor switches are connected in parallel.

In addition, the signal transmission delay caused by the gate wiring inductance is limited to less than several tens of nanoseconds, which is much shorter than the delay using the wiring of prior art. Therefore, the turn-on loss and the turn-off loss of semiconductor switches 20 are reduced. As a result, since the convertible electric power can be increased in proportion to the number of semiconductor switches 20 connected in parallel, the present invention facilitates realizing a large capacity power converting apparatus.

By widening a total area in which source conductor 41 and film gate conductor strips 31a oppose each other through insulating film 51, the gate wiring inductance is further reduced and the turn-on and the turn-off losses of the semiconductor switch are further reduced. The pressed contact, adopted in the present invention in place of screwing and soldering, requires less time and space to produce than does the conventional wired connection. The pressed contact reduces the overall size of the semiconductor switching apparatus in addition to reducing the gate wiring inductance. The present invention is also applicable to connecting a plurality of thyristors or bipolar transistors.

Figure 4:
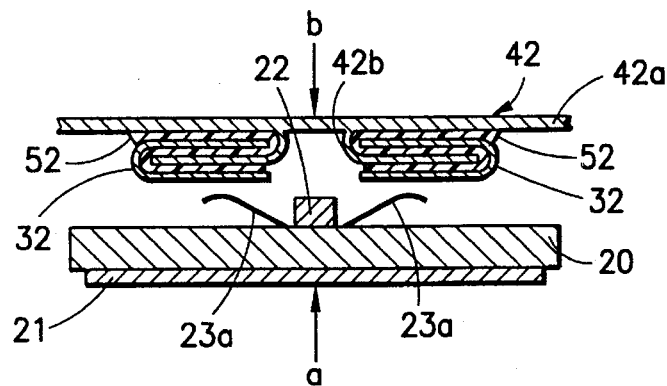
FIG. 4 is an exploded cross section view of the second embodiment of the present invention.

Referring to FIG. 4, a second embodiment of the present invention is shown for connecting semiconductor switches 20 in parallel. A source conductor 42 includes a thick stripe plate 42a and two fins 42b which are thinner than stripe plate 42a. Each fin 42b is bent from near its root so that it is substantially parallel with stripe plate 42a. Two film gate conductors 32, 32 are bent around their longitudinal axes so that each is roughly U-shaped with two arms. Each gate conductor 32 is inserted over each fin 42b so that each fin 42b is between the arms of the "U" of each gate conductor 32. One arm of each "U" is between stripe plate 42a and fin 42b, while the other arm of each "U" is between fin 42b and elastic wing 23a of gate electrode 23. Stripe plate 42a and fins 42b, 42b are insulated from gate conductor 32 by insulating films 52, 52. The arm of the "U" closest to stripe plate 42a is completely insulated by insulating film 52. The other arm is uninsulated on a side facing elastic wing 23a of gate electrode 23. Each fin 42b corresponds to one elastic wing 23a of gate electrode 23 of semiconductor switch 20.

As in the first embodiment, drain conductor 11 (not shown in FIG. 4) is pressed upward as shown by an arrow a against drain electrode 21 by a pressing means (not shown) forming a good electrical connection. Source conductor 42 is pressed downward as shown by an arrow b against source electrode 22 by a pressing means (not shown). The uninsulated arm of the "U" of gate conductor 32 is forced tightly against elastic wings 23a of gate electrode 23. A spring force of elastic wings 23a ensures a good electrical connection.

As in the prior embodiment, gate drive circuit 5 is connected between source conductor 42 and film gate conductors 32, 32 in the second embodiment.

Since source conductor 42 includes thick stripe plate 42a and thin bent fins 42b, between which one arm of the "U" of gate conductor is inserted, a magnetic path along the two fins 42b, 42b and the two gate conductors 32, 32 is elongated. Due to this elongation, a magnetomotive force generated by the gate current in fins 42b and a magnetomotive force generated in gate conductors 32, 32 compensate each other. Therefore, the second embodiment is much more effective in reducing wiring inductance than is the conventional connection by wires or the first embodiment.

When the semiconductor switch 20 is a thyristor, the first electrode is an anode, the second electrode a cathode, and the third electrode a gate electrode. When the semiconductor switch 20 is a bipolar transistor, a collector electrode replaces drain electrode 21, an emitter electrode replaces source electrode 22, and a base electrode replaces gate electrode 23.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A connection structure for connecting a plurality of semiconductor switches in parallel, comprising:

a plurality of first electrodes on a first surface of each of said semiconductor switches;

a plurality of second electrodes protruding from a second surface of each of said semiconductor switches;

a plurality of elastic third electrodes on said second surface and insulated from said second electrodes;

each of said elastic third electrodes including a first elastic wing and a second elastic wing& a first conductor;

a second conductor;

first and second third conductors;

an insulating film interposed between said second conductor and said third conductors;

means for pressing said first conductor and said second conductor toward each other, such that pressed contact of said first conductor with said first electrodes, said second conductor with said second electrodes, and said first and second third conductors with each of said first and second elastic wings, respectively, is established; and connecting means, made of a same material as said third conductors, for connecting said third conductors to each other at ends thereof.

2. The connection structure as claimed in claim 1, wherein each semiconductor switch includes a MOSFET, said first electrodes are drain electrodes, said second electrodes are source electrodes, and said third electrodes are gate electrodes.

3. The parallel connection structure as claimed in claim 1, wherein each semiconductor switch includes an IGBT, said first electrodes are drain electrodes, said second electrodes are source electrodes, and said third electrodes are gate electrodes.

4. The parallel connection structure as claimed in claim 1, wherein each semiconductor switch includes a thyristor, said first electrodes are anodes, said second electrodes are cathodes, and said third electrodes are gate electrodes.

5. The parallel connection structure as claimed in claim 1, wherein each semiconductor switch includes a bipolar transistor, said first electrodes are collector electrodes, said second electrodes are emitter electrodes, and said third electrodes are base electrodes.

6. A connection structure for connecting a plurality of semiconductor switches in parallel, comprising:

a plurality of first electrodes on a first surface of each of said semiconductor switches;

a plurality of second electrodes protruding from a second surface of each of said semiconductor switches;

a plurality of elastic third electrodes on said second surface and insulated from said second electrodes;

a first conductor;

a second conductor;

at least two third conductors;

at least two fins protruding from and bent substantially parallel with said second conductor, whereby each third conductor has an associated fin;

each of said third conductors being bent into a U-shape and having first and second arms;

said first arm being between said second conductor and said associated fin;

said second arm being between said associated fin and said first electrodes;

an insulating film interposed between said second and third conductors and between said associated fin and said third conductor; and means for pressing said first conductor and said second conductor toward each other, thereby establishing pressed contact of said first conductor with said first electrodes, said second conductor with said second electrodes, and said third conductors with said third electrodes.

7. The connection structure as claimed in claim 6, further comprising connecting means, made of a same material as said third conductors, for connecting said third conductors at ends thereof.

8. The connection structure as claimed in claim 6, wherein each semiconductor switch includes a MOSFET, said first electrodes are drain electrodes, said second electrodes are source electrodes, and said third electrodes are gate electrodes.

9. The connection structure as claimed in claim 6, wherein each semiconductor switch includes an IGBT, said first electrodes are drain electrodes, said second electrodes are source electrodes, and said third electrodes are gate electrodes.

10. The parallel connection structure as claimed in claim 6, wherein each semiconductor switch includes a thyristor, said first electrodes are anodes, said second electrodes are cathodes, and said third electrodes are gate electrodes.

11. The parallel connection structure as claimed in claim 6, wherein each semiconductor switch includes a bipolar transistor, said first electrodes are collector electrodes, said second electrodes are emitter electrodes, and said third electrodes are base electrodes.

12. A connection structure for connecting a plurality of semiconductor switches in parallel, comprising:

a plurality of first electrodes on a first surface of each of said semiconductor switches;

a plurality of second electrodes protruding from a second surface of each of said semiconductor switches;

a plurality of elastic third electrodes on said second surface and insulated from said second electrodes;

a first conductor;

a second conductor;

a third conductor being substantially shaped as a hollow rectangle having two long strips and two short strips;

at least two fins protruding from and bent substantially parallel with said second conductor, whereby each of said two long strips of said third conductor has an associated fin;

each of said two long strips of said third conductor being bent into a U-shape and having first and second arms;

said first arm being between said second conductor and said associated fin;

said second arm being between said associated fin and said first electrodes;

an insulating film interposed between said second and third conductor and between said associated fin and said third conductor; and means for pressing said first conductor and said second conductor toward each other, thereby establishing pressed contact of said first conductor with said first electrodes, said second conductor with said second electrodes, and said third conductor with said third electrodes.

* * * * *